United States Patent [19]

Gates, Jr. et al.

[11] Patent Number: 5,568,682

[45] Date of Patent: Oct. 29, 1996

[54] ORTHOGONAL GRID CIRCUIT INTERCONNECT METHOD

[75] Inventors: Louis E. Gates, Jr., Westlake Village; Richard M. Port, Santa Monica, both of Calif.

[73] Assignee: Hughes Aircraft Company, Los Angeles, Calif.

[21] Appl. No.: 332,158

[22] Filed: Oct. 31, 1994

[51] Int. Cl.⁶ .................................................. H05K 3/06
[52] U.S. Cl. .................................. 29/831; 29/832; 29/852
[58] Field of Search ............................ 29/831, 846, 852, 29/832; 427/97; 428/901

[56] References Cited

U.S. PATENT DOCUMENTS

| | | |
|---|---|---|
| 4,262,631 | 4/1981 | Kubacki . |
| 4,946,563 | 8/1990 | Yeatts .................... 29/852 X |
| 5,282,312 | 2/1994 | DiStefano et al. .................. 29/852 X |
| 5,287,619 | 2/1994 | Smith et al. ............................ 29/852 |
| 5,373,629 | 12/1994 | Hupe et al. ............................ 29/852 |
| 5,378,313 | 1/1995 | Pace ................................... 156/643 |
| 5,386,627 | 2/1995 | Booth et al. ........................... 29/852 |

*Primary Examiner*—S. Thomas Hughes
*Attorney, Agent, or Firm*—Leonard A. Alkov; Wanda K. Denson-Low

[57] ABSTRACT

Methods for making low cost, high density circuits for multichip modules using a two-layer interconnect pattern. The circuit is comprised of parallel line segments on each side of the dielectric film, orthogonal to each other to form a mesh or grid when viewed through the film. Line segments are interrupted, as required, to form signal lines connected to each other with metalized vias at appropriately selected intersections of the grid through the dielectric film. Power and ground lines are placed between the signal lines to prevent crosstalk between long parallel line segments. Power and ground lines are also appropriately connected at intersections to form co-connected mesh planes in the two surfaces. The novelty of the invention also resides in the methods of constructing the circuit, wherein circuit patterns on each side and vias are formed simultaneously in a single set of plating operations. Virtually no subtractive etching is required, making the methods environmentally friendly and very low cost. Line feature sizes approach 25 microns or smaller, with line pitch of 50 microns or smaller. Fabricated circuits can accommodate wire-, TAB-, or flip-chip-mounted components, and passive components by adhesive bonding or soldering. Because all lines are formed with additive copper, total circuit resistance is low, typically forty percent lower circuit resistance than signal lines 15 made with aluminum conductors.

11 Claims, 3 Drawing Sheets

ORTHOGONAL GRID CIRCUIT INTERCONNECT METHOD

BACKGROUND

The present invention relates generally to circuit interconnection methods, and more particularly, to orthogonal grid circuit interconnection methods using a two-layer interconnect pattern.

Prior art relating to the present invention involves what is known as multichip module-dielectric (MCM-D) technology, or high density multichip interconnect (HDMI) technology. In accordance with this technology, circuit layers are formed by photoetching sputtered aluminum or copper films applied to spun-on films of dielectric on a ceramic, metal or silicon substrate. Because the HDMI process requires many vacuum operations and etching sequences, completed circuits are very expensive.

A technique for applying all circuitry including power and ground on two layers was conceived by Dr. Leonard Schaper at the University of Arkansas. As described by Dr. Schaper, the technique uses HDMI processes to form the circuits, which includes etching of sputtered metal layers applied to dielectric films spun onto a rigid substrate. This technique, though producing circuits that are less expensive than conventional HDMI circuits because the number of layers is reduced to only two, is still costly because of the number of expensive vacuum sputtering and chemical etching steps that are required. The present invention combines several other known, less expensive processes not used in the Schaper technique, and employs only two layers to produce circuits having a very large format at very low cost.

Another example of the prior art includes what is known as multichip circuit-laminate (MCM-L), which constitutes fineline versions of more conventional printed wiring board (PWB) technology. Using this MCM-L technology, finer line features and smaller through-hole drills are used to produce relatively high density circuits. This technology is useful for moderate density circuits, but it cannot achieve the high density circuit capability of either HDMI or our invention.

Therefore it is an objective of the present invention to provide for improved circuit interconnection methods that combine relatively inexpensive processes and employ only two layers to produce circuits having a very large format at very low cost.

SUMMARY OF THE INVENTION

In order to meet the above and other objectives, the present invention comprises methods for making low cost, high density circuits for multichip modules using a two-layer interconnect pattern. Circuit construction is comprised of parallel line segments on each side of a dielectric film, orthogonal to each other to form a mesh or grid when viewed through the film. Line segments are interrupted, as required, to form signal line paths connected to each other with metalized vias at appropriately selected intersections of the grid through the dielectric film. Power and ground lines are placed between most signal lines to prevent crosstalk between long parallel line segments. Power and ground lines are also appropriately connected at intersections to form co-connected mesh planes in the two surfaces. The novelty of the invention also resides in the method of constructing a circuit, wherein circuit patterns on each side and through-hole interconnects (vias) are formed simultaneously in a single set of plating operations, for example, by sequentially plating the dielectric film with copper, then nickel, then gold to complete the circuit. Virtually no subtractive etching is required, making the process environmentally friendly and very low cost. Line feature sizes approach 25 microns or smaller, with line pitch of 50 microns or smaller. Fabricated circuits can accommodate wire bonded, TAB bonded, or flip chip mounted parts, bumped chips, bumped carriers, and passive components by adhesive bonding or soldering. The final circuit may be mounted directly on a heat sink to effect very efficient thermal management.

The present invention thus provides a very low cost method for making a high density circuit that hits outstanding electrical performance for digital and analog circuits. It provides a mesh plane circuit pattern with orthogonal lines on two surfaces that are interconnected with vias. This pattern is capable of interspersing power or ground lines between all signal lines to minimize crosstalk. Only one dielectric film is required which has all signal lines on two sides. Power and ground distribution is uniform throughout both circuit planes owing to the multiplicity of power and ground grid lines on both surfaces. Because all lines are made with additive copper, total circuit resistance is low, typically forty percent of comparable circuit resistance if signal lines are made with aluminum conductors. The entire circuit is formed onto two sides of a dielectric film, and all plating is done in a single sequence, using copper, nickel and gold, for example, to form circuitry on the two sides, interconnected with vias at intersections of grid lines. Multiple laminations and sequential deposition operations are not necessary.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1A:
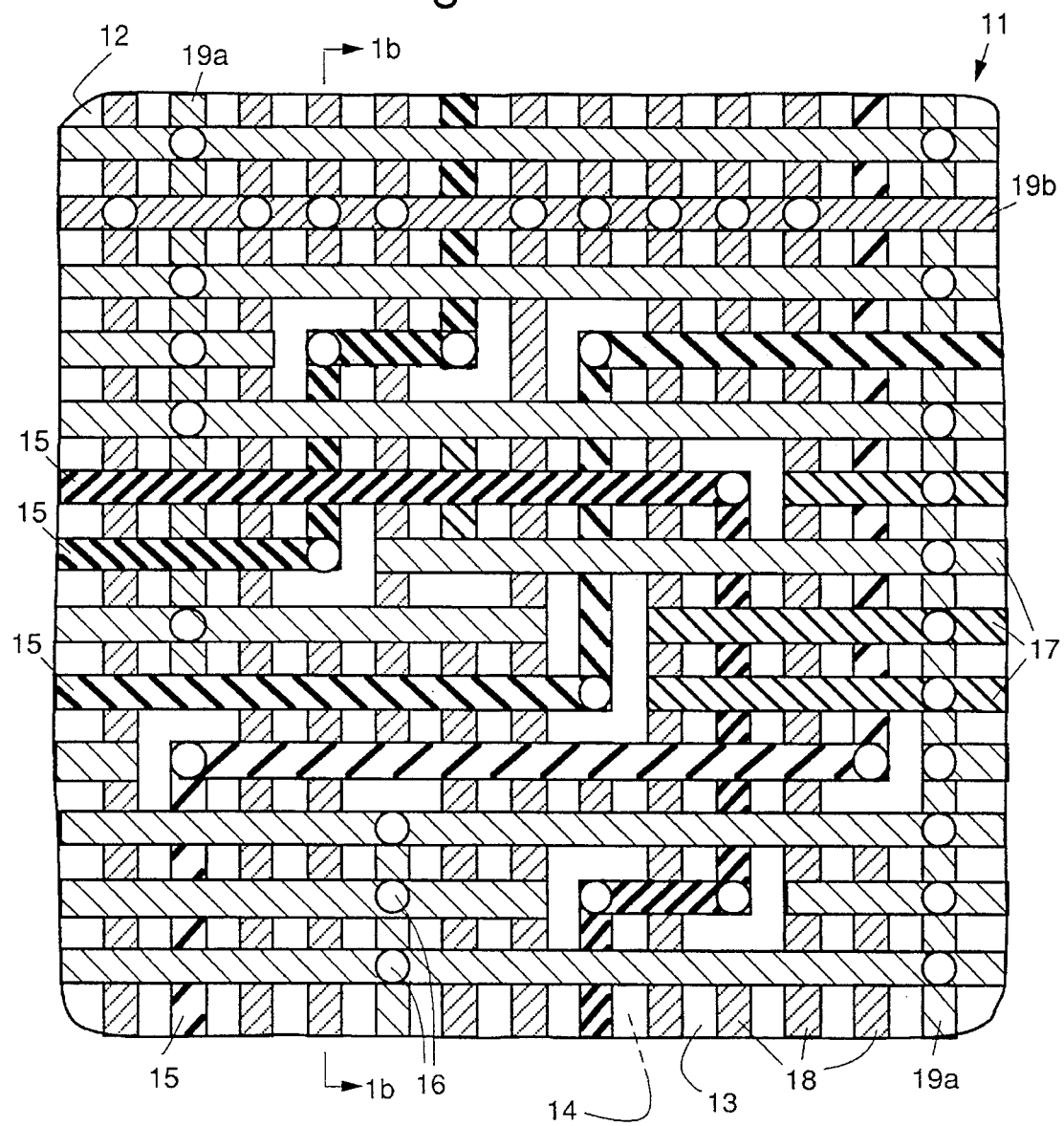
FIGS. 1a and 1b illustrate top and side views, respectively, of a circuit made with fabrication methods in accordance with the principles of the present invention.
Figure 1B:
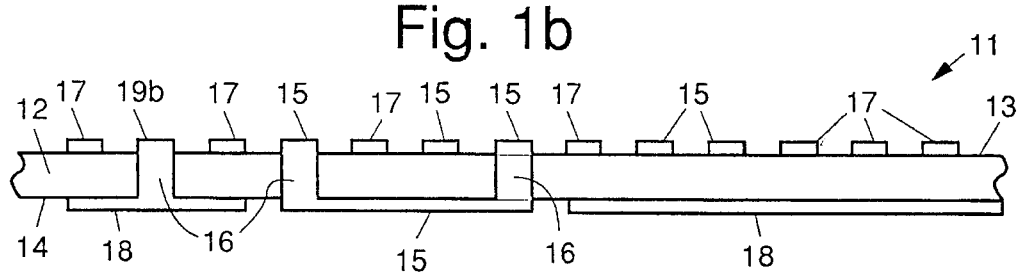

Referring to the drawing figures, FIGS. 1a and 1b illustrate top and side views, respectively, of a circuit 11 made using a fabrication method 20 in accordance with the principles of the present invention. The circuit 11 comprises a single sheet of dielectric film 12 as a support for two plated circuit layers 13, 14, or top and bottom plated circuit layers 13, 14, comprising a plurality of signal traces 15 interconnected through the film 12 by plated through holes 16, or vias 16. The circuit 11 typically includes power and ground lines or traces 17, 18 between most or all of the signal traces 15. To assure continuity between power grid lines, interconnecting lines 19a on the bottom layer 14 connect power grid lines on the top layer 13. In like manner, ground lines on the bottom layer 14 are connected to interconnecting lines 19b on the top layer 13.

Figure 2A:
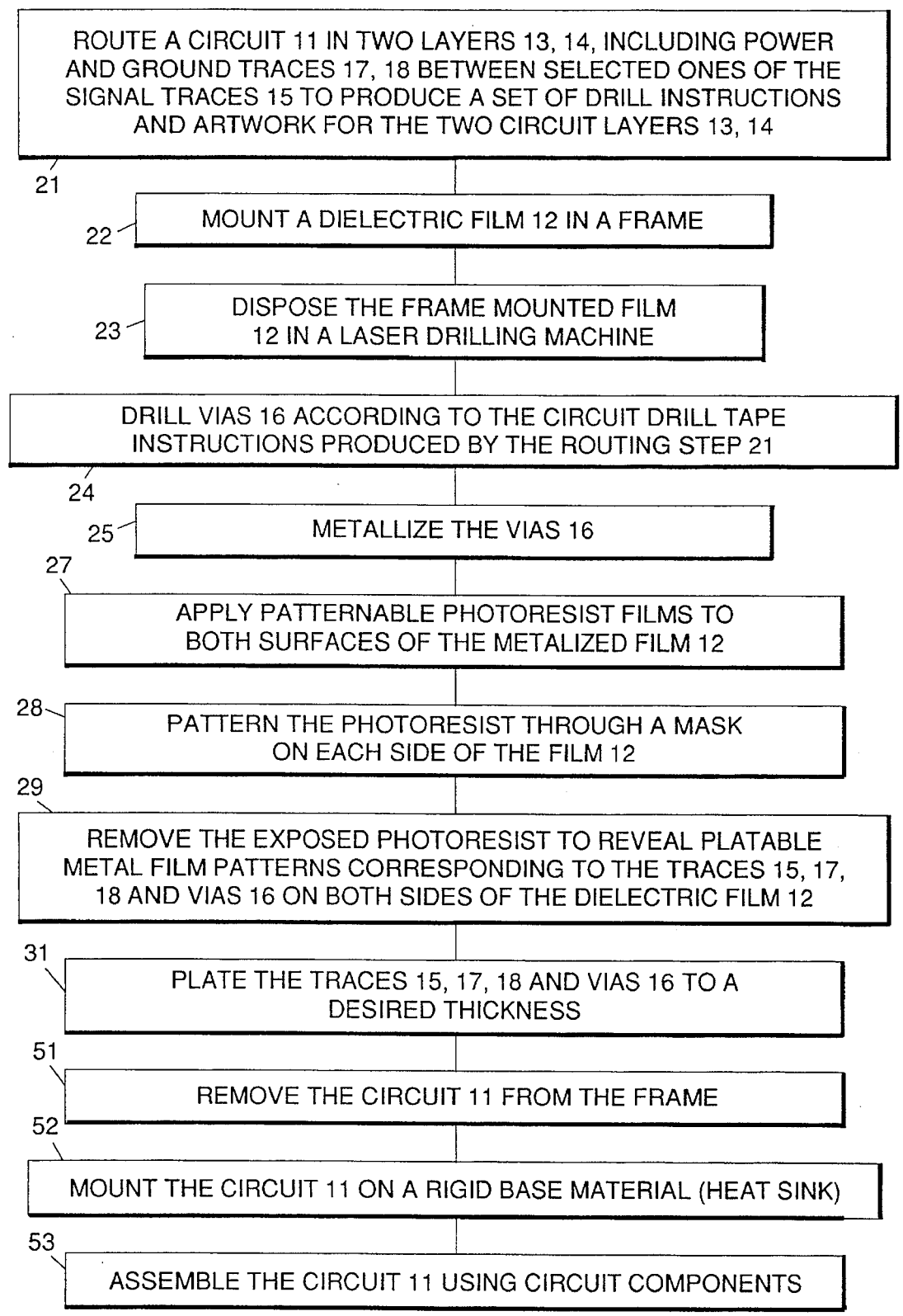
FIGS. 2a and 2b illustrate process flow diagrams for two methods of fabricating circuits in accordance with the principles of the present invention.
Figure 2B:
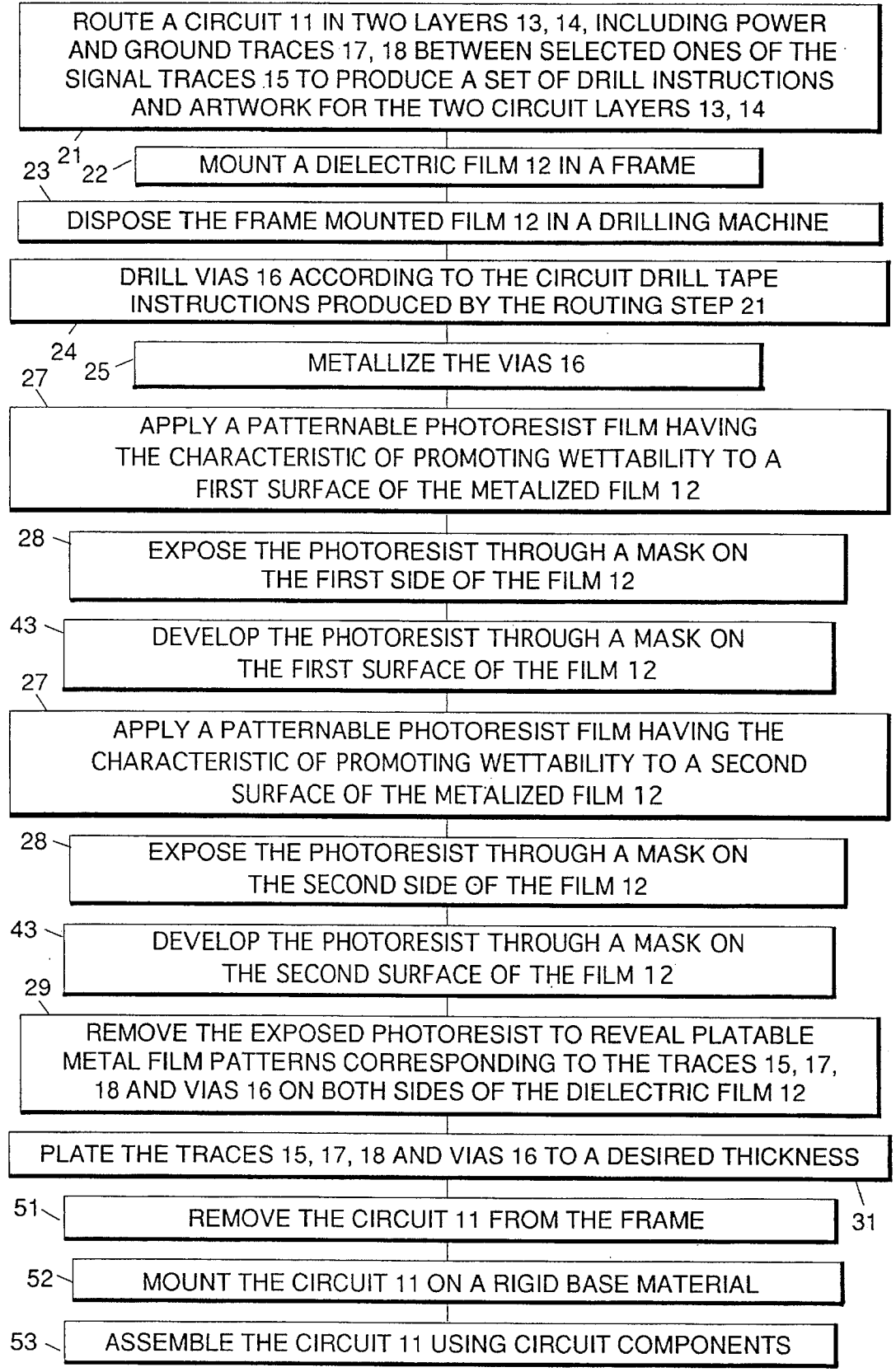

FIG. 2a illustrates a process flow for a method 20 of the principles in accordance with the present invention. The method 20 starts with the single sheet of dielectric film 12 as a support for the two plated circuit layers 13, 14. The signal, power and ground traces 15, 17, 18 are interconnected through the film using the plated through holes 16, or vias 16. Production of the circuit 11 in accordance with the method 20 starts by routing 21 (or routing step 21 ) the circuit 11 in the top and bottom layers 13, 14, including power and ground traces 17, 18 between most or all of the signal traces 15. The routing step 21 is performed using conventional routing procedures. The output of the routing step 21 is a set of drill instructions and artwork for the two layers 13, 14.

A dielectric film 12 is mounted 22 (mounting step 22) in a frame to facilitate handling and processing. The dielectric film 12 may include seed metallization layers 13a, 14a on both sides thereof, and the two plated circuit layers 13, 14 may be applied at a later time. One particularly good material for the dielectric film 12 is available from Sheldahl Corporation under the trade name Novaclad® which may be supplied with a 0.2 µg film of copper on both sides thereof that comprises the seed layers 13a, 14a.

The frame mounted film 12 is disposed 23 in a laser drilling machine and all vias 16 are drilled 24 according to the circuit drill tape instructions produced by the routing step 21. Then the vias 16 are then metalized 25 by conventional techniques known to those skilled in the art, at which time the film surfaces are also metalized 26 if the film 12 is not already metalized. The next step comprises applying 27 patternable photoresist films to both surfaces of the metalized film 12. To achieve the highest definition necessary for fine line circuitry, a dry film photoresist comprising an organic polymer is applied by a plasma enhanced chemical vapor deposition (CVD) process utilizing equipment described in U.S. Pat. No. 4,262,631, for example. The photoresist is then patterned 28 or exposed 28 through a mask on each side using conventional photoexposure techniques. The exposed photoresist is removed 29, revealing platable metal film patterns on both sides of the dielectric film 12. The patterned film, still in its frame, is immersed 30 in a copper plating tank, and the traces 15, 17, 18 and vias 16 are plated 31 to a desired thickness using a single copper plating operation. The circuit 11 may then be further plated 32 with nickel and gold, as required, for subsequent circuit assembly. After plating is complete, the remaining photoresist material is removed 33, exposing the seed metallization layers 13a, 14a on circuit plane open areas. The plated circuit 11 on the dielectric film 12 in its frame is then immersed 34 in an etching tank to remove the seed metallization layers 13a, 14a, thus completing manufacture of the circuit 11.

An alternative method 40 of making the circuit 11 is to pattern 28 and plate 31, 32 both sides of the dielectric film 12 independently, in two separate steps. The film 12 is first mounted 22 in a frame and vias 16 are drilled 24 in the manner disclosed above. Then a different type of CVD photoresist is applied 27 to one side of the circuit 11. This photoresist, which has the characteristic of promoting wettability of the film 12, is then exposed 28 and developed 43 to activate the surface of the film 12 with a circuit pattern which is then then plated 31 with metal such as copper. Likewise, the reverse side of the film 12 is be patterned 28 with a circuit and plated 32. The vias 16 are automatically activated and plated, because the photoresist masking material coats the sidewalls of the vias 16. The plating steps 31, 32 interconnect the traces 15, 17, 18 on both sides of the film 12, completing the circuit 11.

The circuit 11 made by either method 20, 40 is then ready for the next operation, which comprises removing it 51 from the frame and mounting it 52 on a rigid base material. The rigid base material may be a plastic composite board or a metallic or composite heat sink, for example, depending on the final application of the circuit 11. After this is done, the circuit 11 is assembled 53 using circuit components.

Thus the present invention provides methods 20, 40 for making low cost, high density circuits 11 for multichip modules using a two-layer interconnect pattern. The circuit 11 is comprised of parallel line segments on each side of the dielectric film 12, orthogonal to each other to form a mesh or grid when viewed through the film 12. Line segments are interrupted, as required, to form signal lines 15 connected to each other with metalized vias 16 at appropriately selected intersections of the grid through the dielectric film. Power and ground lines 17, 18 are placed between the signal lines to prevent crosstalk between long parallel line segments. Power and ground lines 17, 18 are also appropriately connected at intersections to form co-connected mesh planes in the two surfaces. The novelty of the invention also resides in the methods 20, 40 of constructing the circuit 11, wherein circuit patterns on each side and through-hole interconnects (vias 16) are formed simultaneously in a single set of plating operations, such as by sequentially plating the dielectric film 12 with copper, then nickel, then gold to complete the circuit 11. Virtually no subtractive etching is required, making the methods 20, 40 environmentally friendly and very low cost. Line feature sizes approach 25 microns or smaller, with line pitch of 50 microns or smaller. Fabricated circuits 11 can accommodate wire bonded, TAB bonded, or flip chip mounted components, bumped chips, bumped carriers, and passive components by adhesive bonding or soldering. The circuit 11 may be mounted directly on a heat sink to effect very efficient thermal management.

The circuits 11 produced with the present methods 20, 40 have outstanding electrical performance for digital and analog circuits. Only one dielectric film 12 is required which has all signal lines 15 on its two surfaces. Power and ground distribution is uniform throughout both circuit planes owing to the multiplicity of power and ground grid lines 17, 18 on both surfaces. Because all lines 15, 17, 18 are formed with additive copper, the total circuit resistance is low, typically with 40 percent lower circuit resistance than signal lines made with aluminum conductors. The entire circuit 11 is formed on two sides of the dielectric film 12, and all plating is done in a single sequence, using copper, nickel and gold, for example, to form circuitry on the two sides, interconnected with vias 16 at intersections of grid lines. Multiple laminations and sequential deposition operations are not necessary.

Thus there has been described new and improved orthogonal grid circuit interconnection methods using a two-layer interconnect pattern. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. An orthogonal grid circuit interconnection method for fabricating a circuit, said method comprising the steps of:

routing the circuit in two layers, including power and ground traces between selected signal traces to produce a set of circuit drill tape instructions and artwork for the two circuit layers;

mounting a dielectric film, said dielectric film comprising seed metallization layers on both sides of said dielectric film, in a frame;

disposing the frame mounted film in a laser drilling machine;

drilling vias in said frame mounted film according to the set of circuit drill tape instructions produced by the routing step;

metallizing the vias;

metallizing the surfaces of the dielectric film to produce a metalized film;

applying patternable photoresist films to both surfaces of the metalized dielectric film;

patterning the photoresist through a mask on each side of the film;

removing exposed photoresist from the metalized dielectric film to reveal platable metal film patterns corresponding to the signal traces and vias on both sides of the metalized dielectric film;

plating the signal traces and the vias to a desired thickness to form a plated circuit;

removing the remaining photoresist from the plated circuit to expose the seed metallization layers;

removing the seed metallization layers disposed between the signal traces by immersing the plated circuit on the metalized dielectric film in its frame in an etching tank to remove the seed metallization layers disposed between the signal traces;

removing the plated circuit from the frame;

mounting the plated circuit on a rigid base material; and assembling circuit components on the plated circuit, thereby forming said fabricated circuit.

2. The method of claim 1 wherein the step of applying patternable photoresist films to both surfaces of the metalized film comprises the step of applying a dry film photoresist comprising an organic polymer using a plasma enhanced chemical vapor deposition process.

3. The method of claim 1, wherein the plating comprises nickel and gold.

4. The method of claim 1 wherein the step of mounting the plated circuit on a rigid base material comprises the step of mounting the plated circuit on a plastic composite board.

5. The method of claim 1 wherein the step of mounting the plated circuit on a rigid base material comprises the step of mounting the plated circuit on a metallic or composite heat sink.

6. The method of claim 1 wherein the step of mounting a dielectric film in a frame comprises the step of mounting a very thin dielectric film in the frame to enhance heat transfer from heated devices to a heat sink.

7. An orthogonal grid circuit interconnection method for fabricating a circuit, said method comprising the steps of:

routing the circuit in two layers, including power and ground traces between selected signal traces to produce a set of circuit drill tape instructions and artwork for the two circuit layers;

mounting a dielectric film in a frame;

disposing the frame mounted film in a laser drilling machine;

drilling vias in said frame mounted film according to the circuit drill tape instructions produced by the routing step;

metallizing the vias;

metallizing the dielectric film to produce a metalized film;

applying a patternable photoresist film having the characteristic of defining a circuit pattern on a first surface of the metalized film;

exposing the photoresist through a mask on the first surface of the metalized film;

developing the photoresist through a mask on the first surface of the metalized film;

applying a patternable photoresist film having the characteristic of defining a circuit pattern on a second surface of the metalized film;

exposing the photoresist through a mask on the second surface of the metalized film;

developing the photoresist through a mask on the second surface of the metalized film;

removing the exposed photoresist from the metalized dielectric film to reveal platable metal film patterns corresponding to the signal traces and vias on both sides of the metalized film;

plating the signal traces and the vias to a desired thickness to form a plated circuit;

removing remaining photoresist from the plated circuit to expose seed metallization layers;

removing the seed metallization layers disposed between the signal traces by immersing the plated circuit on the dielectric film in its frame in an etching tank to remove the seed metallization layers disposed between the signal traces;

removing the plated circuit from the frame;

mounting the plated circuit on a rigid base material; and assembling circuit components on the plated circuit, thereby forming said fabricated circuit.

8. The method of claim 7, wherein the plating comprises nickel and gold.

9. The method of claim 7 wherein the dielectric film comprises seed metallization layers on both sides.

10. The method of claim 7 wherein the step of mounting the plated circuit on a rigid base material comprises the step of mounting the plated circuit on a plastic composite board.

11. The method of claim 7 wherein the step of mounting the plated circuit on a rigid base material comprises the step of mounting the plated circuit on a metallic or composite heat sink.

* * * * *